US007306890B2

(12) United States Patent
Ishida et al.

(10) Patent No.: US 7,306,890 B2
(45) Date of Patent: Dec. 11, 2007

(54) ALUMINUM ALLOY PLATE FOR LITHOGRAPHIC PRINTING FORM AND METHOD FOR PRODUCTION THEREOF AND LITHOGRAPHIC PRINTING FORM

(75) Inventors: Mitsuo Ishida, Tatebayashi (JP); Keitarou Yamaguchi, Tagata-gun (JP)

(73) Assignees: Mitsubishi Aluminum Co., Ltd., Tokyo (JP); Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/500,088

(22) PCT Filed: Dec. 27, 2002

(86) PCT No.: PCT/JP02/13839

§ 371 (c)(1), (2), (4) Date: Jun. 24, 2004

(87) PCT Pub. No.: WO03/057934

PCT Pub. Date: Jul. 17, 2003

(65) Prior Publication Data

US 2005/0019698 A1 Jan. 27, 2005

(30) Foreign Application Priority Data

Dec. 28, 2001 (JP) ............................ 2001-401685

(51) Int. Cl.
*G03F 7/00* (2006.01)
*G03P 7/004* (2006.01)

(52) U.S. Cl. .............................. 430/270.1; 430/278.1; 430/302

(58) Field of Classification Search ............ 430/270.1, 430/278.1, 302
See application file for complete search history.

(56) References Cited

U.S. PATENT DOCUMENTS

| | | | | |
|---|---|---|---|---|
| 6,494,137 B2 * | 12/2002 | Sawada et al. | ............. | 101/459 |
| 2005/0019698 A1 * | 1/2005 | Ishida et al. | ................ | 430/302 |

FOREIGN PATENT DOCUMENTS

| | | |
|---|---|---|
| EP | 0 942 071 A1 | 9/1999 |
| JP | 52-29301 | 3/1977 |
| JP | 8-179496 | 7/1996 |
| JP | 11-61364 | 3/1999 |
| JP | 11-151870 | 6/1999 |

* cited by examiner

*Primary Examiner*—Amanda Walke
(74) *Attorney, Agent, or Firm*—RatnerPrestia

(57) ABSTRACT

The present invention provides an aluminum alloy plate for use as a lithographic printing plate having an improved uniformity of a surface roughened by electrolytic etching and wherein streaking does not occur, and a method for producing the same. The present invention is characterized in comprising, in wt %, Fe: 0.1 to 0.6%; Si: 0.02 to 0.2%; Cu: 0.001 to 0.02%; Zn: 0.01 to 0.1%; Mg: 0.005 to 0.1%; Ti: 0.001 to 0.05%, and the remainder Al and inevitable impurities, and an average value of the crystal particle size is 60 μm or less in a direction perpendicular to the rolling direction.

9 Claims, 1 Drawing Sheet

ALUMINUM ALLOY PLATE FOR LITHOGRAPHIC PRINTING FORM AND METHOD FOR PRODUCTION THEREOF AND LITHOGRAPHIC PRINTING FORM

This application is a U.S. national phase application of PCT International phase application number PCT/JP02/13839 filed Dec. 27, 2002.

TECHNICAL FIELD

The present invention relates to an aluminum alloy plate for use as a lithographic printing plate on which a photosensitive layer is formed in advance and which is used as is or after a developing process or after the photosensitive layer is subjected to a printing process, and a method for manufacturing the same, and in particular relates to a technique for providing an aluminum alloy plate and a lithographic printing plate having excellent uniformity of a surface roughened by electrolytic etching.

BACKGROUND ART

In lithographic printing, a presensitized plate comprising a photosensitive body of a diazo compound or the like and an aluminum alloy plate is subjected to processing such as image exposure, developing and the like to obtain a plate on which an image portion has been formed, and is wrapped around the cylindrical plate drum of a press, and under the presence of moisturizing water adhered to the non-image portions, ink is adhered to the image portions, and this adhered ink is transferred to a rubber blanket, and printed on the surface of a paper.

As the support body of the above presensitized plate, it is usual to use an aluminum alloy plate which has been subjected to a surface treatment such as a roughening process by electrolytic etching (graining), an anodic oxidation treatment or the like. As an aluminum alloy used for this type of application, JIS 1050 (pure Al, having a purity 99.5% and above), JIS 1100 (an alloy of Al and 0.05 to 0.20% Cu) and JIS 3003 (an alloy of Al, 0.05 to 0.20% Cu, and 1.5% Mn) were mainly used at first.

Various characteristics are required for this type of aluminum alloy plate for use as a lithographic printing plate, such as:

(1) A surface uniformly roughened by electrolytic etching.

(2) Good adhesiveness for a photosensitizer.

(3) Contamination does not arise at the image portion during printing.

However, because the products specified by JIS 1050, JIS 1100, and JIS 3003 cannot sufficiently satisfy all of the above requirements, many improvements have been made to the alloy compositions and the state of the surface that can be obtained.

For example, the surface roughening process is carried out to fix and adhere the photosensitive layer, in addition to providing water retentivity to the surface of the aluminum alloy plate. However, with prior surface roughening treatments, unetched portions would arise on the roughened surface, and the distribution of the pits formed by the surface roughening was uneven, which had considerably adverse effect on the performance of the printing plate, and there has been demand to improve the surface state.

In the past, from the above viewpoint, improvements in materials have been tested, and as one method, it has been proposed to add special elements to the material. For example, Japanese Unexamined Patent Application, First Publication No. Hei 11-115333 discloses a method wherein by the addition of a predetermined amount of Ni, the formation of pits is promoted, and the etchability is increased; Japanese Unexamined Patent Application, First Publication No. Sho 58-210144 discloses a method wherein by the addition of Sn, In and Ga, micropits are formed and the etchability is increased.

However, even if the above special elements are added, the above mentioned requirements cannot be met, and further, by adding these particular elements, there are the problems that increases in material costs are incurred, and the recyclability is impaired.

Further, a method has been proposed for improving the etchability without adding special elements, by focusing on and controlling the size and density of the intermetallic compound (Japanese Unexamined Patent Application, First Publication No. Hei 11-151870). In this method, the intermetallic compound becomes the starting point of the etching, and micropits are uniformly formed. However, the etchability according to this method cannot be sufficiently improved, and the above requirements cannot be satisfied.

Based on the research of the present inventors, it was learned that it is not possible to obtain sufficient etchability by controlling the size and density of the above intermetallic compounds, because the chemical solubility of these intermetallic compounds is unexpectedly large, and they dissolve in the electrolytic solution, and are eliminated, and as a result, they do not sufficiently function as the starting points of etching pits. As a result of further progress in their research, it was found that by moderately dispersing particles of a metastable AlFe type intermetallic compound, the etchability is greatly improved, and the above requirements can be sufficiently met.

Further, the present inventors learned as a result of further progress in research on this type of presensitized plate, that in the case of subjecting an aluminum alloy plate to an electrolytic etching process by immersion in an electrolytic treatment solution, as the aluminum plate is moved from the roll, at right angles to the direction of the aluminum plate (the direction of moving the aluminum plate), streaking, the primary cause of uneven etching, readily occurs on the aluminum plate. This streaking occurs especially readily when the line speed is increased and the electrolytic etching treatment time is short, and at the portions where unevenness arises, i. e., at the portions where the surface roughening is shallow, the streaking remains even in the final state of the product of a presensitized plate provided with a photosensitive layer, and this is connected with an unfavorable external appearance, and there is great concern that the adhesion of the photosensitive film will be low and the durability will be reduced.

Further, for this type of presensitized plate, in some types of products, an even higher degree of strength is demanded. For example, in the case that the presensitized plate is chucked on a roll, a bend is made at the end portion to fix and wrap it around the print cylinder, but this bend is in a direction perpendicular to the direction of rolling, namely it occurs in a direction parallel to the above streaking, and therefore there is the problem that there is concern of cracks arising in the presensitized plate when it is bent.

For example, in order to prevent the occurrence of the above streaking, it can be considered to subject it to a strong electrolytic etching treatment, but the present inventors discovered that as a result of this, the anode site undergoes stronger etching than the cathode site, and therefore, pits which are initially moderately formed have a tendency to become overetched, and these overetched portions can easily overlap the above mentioned bent portions. If the above cracks develop in a presensitized plate, ruptures are likely to form with these cracks as their origin.

DISCLOSURE OF THE INVENTION

The present invention has the objective of providing an aluminum alloy plate for use as a lithographic printing plate which is not subject to the occurrence of streaking, which has few unetched portions, and which by electrolytic etching so as to make the pits uniform, has improved uniformity of the surface roughening, without requiring the addition of special chemical elements, and a method for producing the same.

Further, the present invention has the objective of providing an aluminum alloy plate for use as a lithographic printing plate where the uniformity of the surface roughening is improved, and streaking does not occur, and at the same time, which has improved strength, and does not readily crack at the time of mounting onto a print cylinder, and where rupturing does not occur, and a method for producing the same.

By their research, as a result of their consideration of the mechanism which originates the above streaking, the present inventors found that the occurrence of streaking relates to the frequency of the AC current used for the electrolytic etching.

That is, the reason for the streaking of the surface of the aluminum alloy plate is believed to be as follows. In the aluminum alloy plate immersed in the electrolytic solution, at the portion to which the anodic current is applied (the anode portion), the aluminum is dissolved by the reaction $Al \rightarrow Al^{3+}+3e^-$, and pits are formed and the color becomes white. On the other hand, at the portion to which the cathodic electric current is applied (the cathode portion), there is only production of gas by the reaction $2H^++2e^- \rightarrow H_2$, and there is almost no solvation of the aluminum. As a result, it was found that streaking is formed depending on the frequency of the AC current.

The present invention was made by advancing the study of the characteristics of aluminum alloy materials in order to control the generation of streaking based on such a generation mechanism.

The aluminum alloy plate for use as a lithographic printing plate of the present invention comprises, in wt %, Fe: 0.1 to 0.6%; Si: 0.02 to 0.2%; Cu: 0.001 to 0.02%; Zn: 0.01 to 0.1%; Mg: 0.005 to 0.1%; Ti: 0.001 to 0.05%, and the remainder Al and inevitable impurities, and the average value of the crystal particle size in the direction perpendicular to the direction of rolling is 60 μm or less.

The aluminum alloy plate for use as a lithographic printing plate of the present invention includes a plurality of intermetallic compound particles within the metallic structure of the above disclosed invention, and is characterized in that in said intermetallic compound particles, the value of the ratio A/B is 0.2 or more, where A is the number of said intermetallic compound particles having an equivalent-circle diameter of 0.1 to 1.0 μm, and B is the total number of particles of 0.1 μm or above.

The aluminum alloy plate for use as a lithographic printing plate of the present invention includes a plurality of intermetallic compound particles in the metallic structure of the above mentioned invention, and is characterized in that in said intermetallic compound particles, the value of $(D/E)\times 100$ is 0.2 or more, where D is the included amount of intermetallic compound particles having an equivalent-circle diameter of 0.1 μm or more and less than 1.0 μm, and E is the included amount of particles having an equivalent-circle diameter of 1.0 μm or more.

The aluminum alloy plate for use as a lithographic printing plate of the present invention is characterized in that the above amounts of Cu, Fe, Zn and Mg satisfy the relationship equation: $0.15 \geqq Zn+Mg-(Fe/10)-Cu$.

The aluminum alloy plate for use as a lithographic printing plate of the present invention is characterized in that in the composition of said intermetallic compound particles, the value of C/B is 0.35 or above, where C is the number of metastable phase particles with a Fe/Al ratio of 0.6 or less, and B is the total number of intermetallic compound particles.

The aluminum alloy plate for use as a lithographic printing plate of the present invention is characterized in that it comprises a metastable dispersion layer comprising a metastable phase of AlFe type intermetallic compound particles dispersed in at least its surface layer portion.

The production method of the present invention is a method for producing an aluminum plate for use as a lithographic printing plate characterized in comprising, in wt %, Fe: 0.1 to 0.6%; Si: 0.02 to 0.2%; Cu: 0.001 to 0.02%; Zn: 0.01 to 0.1%; Mg: 0.005 to 0.1%; Ti: 0.001 to 0.05%, and the remainder Al and inevitable impurities, and having an average value of the crystal particle size in the direction perpendicular to the rolling direction of 60 μm or less, the method being characterized in that ingots of the alloy of said composition are subjected to a homogenizing treatment at 550° C. or less, or subjected to soaking without being subjected to a homogenization treatment, and hot rolled.

The production method of the present invention is characterized in being a method for producing an aluminum alloy plate for use as a lithographic printing plate comprising a plurality of intermetallic compound particles in its metallic structure, and in said intermetallic compound particles, the value of A/B is 0.2 or above, where A is the number of said intermetallic compound particles having an equivalent-circle diameter of 0.1 to 1.0 μm, and B is the total number of particles having an equivalent-circle diameter of 0.1 μm and above.

The production method of the present invention is characterized in being a method for producing an aluminum alloy plate for use as a lithographic printing plate comprising a plurality of intermetallic compound particles in its metallic structure, and in terms of the equivalent-circle diameter, in said intermetallic compound particles, the value of $(D/E)\times 100$ is 0.2 or more in terms of equivalent-circle diameter of 0.1 μm or above, where D is the amount of intermetallic compound particles less than 1.0 μm, and E is the amount of particles 1.0 μm or more.

The production method of the present invention is characterized in being a method for producing an aluminum alloy plate for use as a lithographic printing plate wherein, in the composition of said intermetallic compound particles having a particle diameter of 0.1 μm or more, the value of C/B is 0.35 or less, where C is the number of metastable particles having a Fe/Al ratio of 0.6 or less, and B is the total number of intermetallic compound particles.

The production method of the present invention is characterized in being a method for producing an aluminum alloy plate for use as a lithographic printing plate comprising a metastable dispersion layer with metastable phase AlFe type intermetallic compound particles dispersed in at least its surface layer portion.

The lithographic printing plate of the present invention is characterized in that a photosensitive layer is provided on the aluminum alloy plate for use as a lithographic printing plate, wherein any of the preceding aluminum plates is subjected to at least a surface roughening or an anodic oxidation treatment.

The invention explained above has a composition comprising in wt %, Fe: 0.1 to 0.6%; Si: 0.02 to 0.2%; Cu: 0.001 to 0.02%; Zn: 0.01 to 0.1%; Mg: 0.005 to 0.1%; Ti: 0.001 to 0.05%, and the remainder Al and inevitable impurities, and the average crystal particle size in the direction perpendicular to the direction of rolling is 60 μm or less, and therefore, the intermetallic compound particles of all sizes which can be the starting points for reactions can be uniformly distributed, and by providing a metastable phase of an intermetallic compound, in the case of electrolytic etching, as a result of being able to obtain a good balance of both the reactions at the anode portion and the cathode portion, it is possible to obtain an aluminum plate for use as a lithographic printing plate where streaking does not occur.

Further, in the present invention, an appropriate amount of Mn is added to improve the strength, and therefore, the rupture resistance and the durability are excellent, and at the same time, along with the addition of Mg, the alloy elements of Fe, Si, Cu, Zn and Ti are included within a range of amounts, and therefore, in addition to providing rupture resistance and durability, it is possible to provide an aluminum alloy plate where streaking does not occur.

Further, by setting the value of A/B to 0.2 or more, as a result of being able to further improve the balance of the reactions at the anode portion and the cathode portion, it is possible to obtain an aluminum alloy plate for use as a lithographic printing plate where streaking does not occur, and having an even more excellent performance with respect to rupture resistance and durability. Further, an aluminum alloy plate comprising a metastable dispersion layer where a metastable phase of AlFe intermetallic compound particles are dispersed in at least a surface portion of the plate can be preferably applied to the present invention.

Further, according to the production method of the present invention, in the production of an aluminum alloy plate for use as a lithographic printing plate having the above composition and provided with the above characterized intermetallic composition particles, alloy ingots of the above composition are subjected to a homogenization treatment at a temperature of 550° C. or below, or are subjected to a soaking treatment without being subjected to a homogenization treatment and hot rolled, and therefore, it is possible to obtain an aluminum alloy phase wherein an intermetallic compound which is a metastable phase which is not eliminated can be reliably deposited, and therefore, an aluminum alloy plate for use as a lithographic printing plate wherein streaking does not occur and with even more excellent performance concerning rupture resistance and printing durability can be obtained.

BEST MODE FOR CARRYING OUT THE INVENTION

Figure 1:
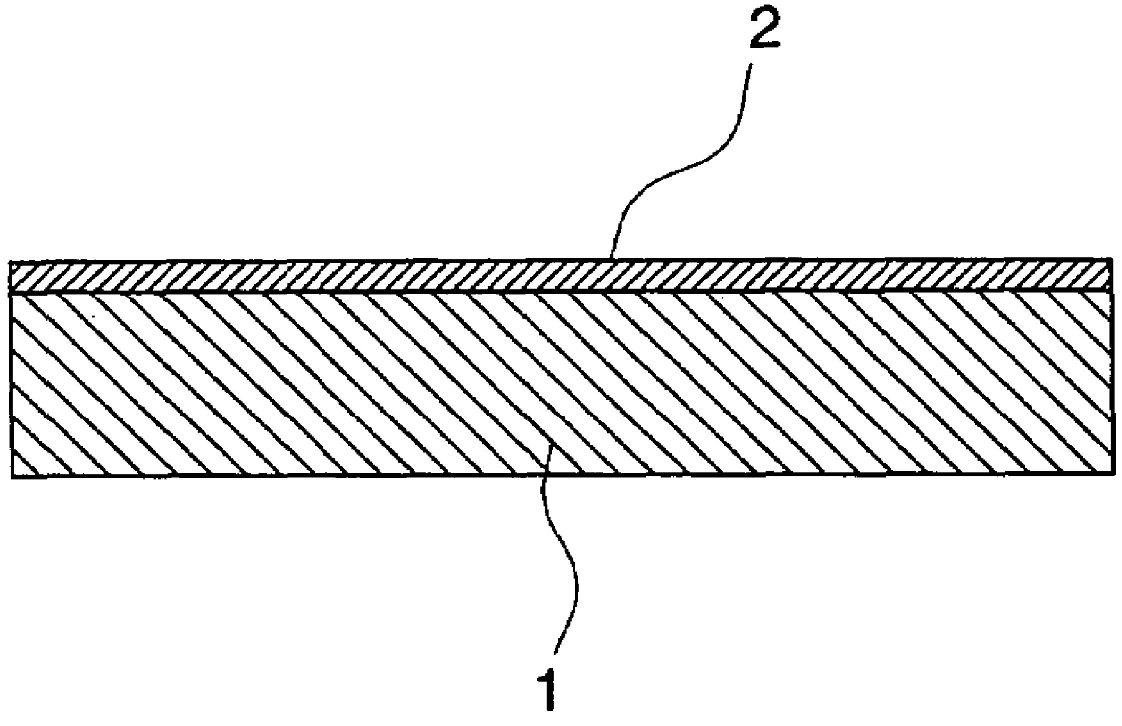
FIG. 1 is a sectional view of the lithographic printing plate of the present invention.

The embodiments of the inventions are explained below, but needless to say, the present invention is not limited to these embodiments.

The present inventors considered the uniformity of electrolytic etching of the aluminum alloy support body for use as a presensitized plate in order to solve the above problems, and discovered the following.

(1) An Al—Fe type intermetallic compound crystallizes or precipitates in the aluminum matrix, acts as the cathode point during electrolytic etching, and controls the solubility of the aluminum alloy support body for use as a presensitized plate.

(2) The present inventors believed that to control the occurrence of the above mentioned streaking, it would be effective to increase the solubility of the material of the cathode portion (the cathode solubility). Namely, by making the portion receiving the cathode reaction whiten, the difference in appearance between the anode and the cathode is reduced, and the streaking is controlled.

From this point of view, the elements to be added to the aluminum were considered, and the effects of the added elements were studied, and it was found that for the added components Si, Cu, and Ti, and the like, by increasing the amount added, the solubility is decreased. However, if the added amount of Cu is too low, the solubility of the cathode decreases, and it became clear that an added amount within the range of 0.001 to 0.02% is appropriate. On the other hand, Fe, Zn and Mg increase the solubility of the cathode, and the best results could be obtained by setting a relational formula specifying the added amount of Zn and Me, with respect to the added amount of Fe and Cu.

With the above background, in the present embodiments, in order to achieve these types of objectives, it is preferable for an aluminum alloy plate for use as a lithographic printing plate to comprise, in wt %, Fe: 0.1 to 0.6%; Si: 0.02 to 0.2%; Cu: 0.001 to 0.02%; Zn: 0.01 to 0.1%; Mg: 0.005 to 0.1%; Ti: 0.001 to 0.05%, and the remainder Al and inevitable impurities, with an average value of the crystal particle size in the direction perpendicular to the rolling direction of 60 μm or less.

Further, this type of aluminum alloy plate includes intermetallic compositions (AlFe type, AlFeSi type, Si type, Ti type), and it was found that to the extent that these intermetallic compositions are finely dispersed, the cathode reaction increases, and the streaking can be reduced.

The conditions for this are, in the previously disclosed intermetallic composition particles, in terms of the equivalent-circle diameter, a value of A/B of 0.2 or above for the case that A is the number of particles with an equivalent-circle diameter of 0.1 to 1.0 μm, and B is the total number of particles. Further, the upper limit for the value of A/B is on the order of 50, and if the value is higher than this, the effect of improving the streaking is very small.

Alternatively, as the conditions, in said intermetallic compound particles, the value of (D/E)×100 is 0.20 or above in the case that D is the amount of intermetallic compound particles having an equivalent-circle diameter of 0.1 μm or more and less than 1.0 μm, and E is the amount of particles of 1.0 or more.

The intermetallic compound particles which effectively control the shape of the pits have a size of 0.1 μm to 1.0 μm. Intermetallic compound particles having a size exceeding 1.0 μm coarsen the pits. Accordingly, it is preferable to have a large amount of particles of 0.1 to 1.0 μm. A value of (D/E)×100 of 0.20 or above can control the occurrence of streaking, and further, can control the coarsening of the pits. The upper limit of the value of (D/E)×100 is on the order of 300, and even if it is increased above this, the improvement in the effect is small, and the rolling costs increase by reducing the hot rolling temperature, and increasing the number of rolling passes, and the like.

Further, in the AlFe type intermetallic compound, a metastable phase is more preferable than a stable phase ($Al_3Fe$), and in the composition of the intermetallic compound having a particle size of 0.1 μm or more, if the value of C/B is 0.35 or above when "C" is set as the number of metastable particles having an Fe/Al ratio of 0.6 or less, and "B" is set as the total number of particles of the intermetallic compound, it was found that a large further improvement could be obtained. The upper limit of the value of C/B is on the order of 0.80, and even if it is increased above this, the improvement in the effects is small, and the rolling costs increase by reducing the hot rolling temperature, and the number of rolling passes increases and the like.

Further, concerning the surface layer portion in which the intermetallic compound particles are dispersed, in the case for use as a lithographic printing plate, it is thought not to be a hindrance if the range of the depth on the order of 50 μm from the outer surface contributes to the etching process to which it is subjected.

Below, the reasons for limiting the alloy components for the aluminum alloy plate for use as a lithographic printing plate specified by the present invention are explained. Further, in the specification of the present application, when the interval between the upper limit and the lower limit of the included amount is indicated by "to", as long as there is no particular indication, this means "or more", and "or less". Accordingly, as long as there is no other particular indication, 0.1 to 0.6 means a range of 0.1 wt % or more, and 0.6 wt % or less.

"Fe": 0.1 to 0.6 wt %

Fe is an element which has a large influence on the occurrence of streaking. If the included amount of Fe is less than 0.1 wt %, the cathode reaction is insufficient, and the streaking is intensified. Further, if the included amount of Fe exceeds 0.6 wt %, a coarse intermetallic compound readily forms, and further, the cathode solubility decreases and streaking is intensified. Further, a preferable range of the included amount of Fe is 0.2 to 0.5 wt %. A more preferable range of the included amount of Fe is 0.2 to 0.4 wt %.

"Si": 0.02 to 0.2 wt %

Si is an element which precipitates in the elemental aluminum and contributes to making the crystal particles fine. If the included amount of Si is less than 0.02 wt %, it is necessary to use other metals having a high degree of purity, and the cost will increase significantly. Further, if the included amount of Si exceeds 0.2 wt %, the intermetallic compound becomes coarse and the reactivity of the cathode decreases, and there is a tendency to intensify the occurrence of streaking. A more preferable range for the included amount of Si is 0.05 to 0.15 wt %.

"Zn": 0.01 to 0.1 wt %

Zn is an element which has a large influence on the occurrence of streaking. With included amounts of Zn of less than 0.01%, the cathode solubility insufficient, and it is difficult to obtain an improved effect on the streaking. Further, if the included amount of Zn exceeds 0.1 wt %, the cathode solubility increases too much, and streaking is intensified. Further, a preferable range of the included amount of Zn is 0.025 to 0.08 wt %, and a higher degree of uniformity of the roughened surface can be obtained.

"Ti": 0.001 to 0.05 wt %

Ti is an element which makes the crystal particles fine, but if the amount of Ti is less than 0.001 wt %, this effect cannot be obtained. Further, if the amount of Ti exceeds 0.05 wt %, the coarse precipitates increase and the solubility of the cathode decreases, and there is a tendency for streaking to be intensified. A more preferable range of the included amount of Ti is 0.005 to 0.02 wt %.

"Cu": 0.001 to 0.02 wt %

Cu is an element which has a large influence on the occurrence of streaking. If the included amount of Cu is less than 0.001 wt %, the solubility of the cathode is insufficient. Further, if the included amount of Cu exceeds 0.02%, the cathode solubility decreases and streaking is intensified. Further, a preferable range of the included amount of Cu is 0.001 wt % or more, and less than 0.005 wt' %. A more preferable range of the included amount of Cu is 0.001 wt % or more, and 0.004 wt % or less, to further increase the uniformity of the roughened surface.

"Mg": 0.005 to 0.1 wt %

Mg is an element which has a large influence on the occurrence of streaking. If the included amount of the same is less than 0.005 wt %, the solubility of the cathode is insufficient, and the effect of increasing the strength is small, and to the contrary, if the included amount exceeds 0.1%, the solubility of the cathode decreases, and streaking is intensified. A more preferable range of the included amount of Mg is 0.021 wt % or more and 0.08 wt % or less, and further, in the range of 0.021 to 0.08 wt %, the uniformity of the roughened surface becomes even higher, and furthermore, the most more preferable range is 0.021 wt % or above, and 0.04 wt % or less.

"Inevitable Impurities"

As impurities which can be included in the aluminum alloy plate of the invention of the present application, Mn, Y, Sn, Zr, Ga, Ni, In and the like are given as examples. The included amount of these impurities should preferably be held to 0.03 wt % or less of each.

"The Relationship between the Included Amounts of Cu, Fe, Zn and Mg"

For the elements Cu, Fe, Zn and Mg, which have a large influence on the occurrence of streaking, it is preferable that the relationship between their included amounts satisfy the relationship equation $0.15 \geqq Zn+Mg-(Fe/10)-Cu$. In particular, by increasing the amounts of Cu and Fe, the reactivity of the cathode is decreased. In response to this effect, it is necessary to suitably increase the amount of Zn. Further, in order to have a balance of increased strength and cathode solubility in an appropriate range, it is necessary to adjust the included amount of Mn.

Further, of the many previously mentioned composition ranges, as an example of the most preferred composition range, in wt %, Fe: 0.2 to 0.4%; Si: 0.05 to 0.15%; Cu: 0.001 to 0.004%; Zn: 0.025 to 0.08%; Mg: 0.02 to 0.04%; Ti: 0.001 to 0.05%, and the remainder Al and inevitable impurities, can be given.

"Intermetallic Compound Particles"

The intermetallic compound particles form the starting points of the etching pits, and therefore, the size of the particles in the previously mentioned dispersion layer wherein they are dispersed has an effect on the properties of the pits which later form there. If this particle size is too small (equivalent-circle diameter less than 0.1 μm) the particles are too fine and they do not sufficiently function as the starting points of etching pits, on the other hand, if the particle size is too large (equivalent-circle diameter exceeding 1.0 μm), the uniformity of the pits decreases. Accordingly, it is considered that the particle size for the intermetallic compound particles that has a suitable effect on pit formation is an equivalent-circle diameter of 0.1 μm to 1.0 μm.

Accordingly, in the surface direction, the higher the ratio of particles within this range of sizes among the intermetallic compound particles, the better the etchability that can be obtained. The surface direction means a surface direction parallel to the surface at a position at an arbitrary depth in the dispersion layer. Further, the presence of intermetallic compound particles less than 0.1 μm can mostly be ignored as starting points of pits, and therefore, it is possible to consider only the intermetallic composition particles of 0.1 μm or greater, and specify the ratios of the particles within the above range.

Concerning the intermetallic composition particles, it is preferable for the value of A/B to be 0.2 or above in the case that A is the number of particles having an equivalent-circle diameter of 0.1 to 1.0 μm, and B is the total number of particles of the intermetallic compound particles.

If the value of A/B is less than 0.2, the cathode solubility decreases, and streaking tends to be intensified. It is suitable for the value of A/B to be 0.3 or above. The upper limit for A/B is on the order of 50, and if it exceeds this, the effect of improving the streaking is small.

Further, for the above mentioned intermetallic compound particles, it is preferable for the value of (D/E)×100 to be 0.20 or above in the case that D is the included amount of the intermetallic compound particles having an equivalent-circle particle diameter of 0.1 μm or more and less than 1.0 μm, and E is the included amount of particles with an equivalent-circle diameter of 1.0 μm or above.

Further, the particles having an effective action on the shape of the pits have a size of 0.1 to 1.0 μm. Particles having a size exceeding 1.0 μm coarsen the pits. Accordingly, it is preferable to have a large amount of particles of 0.1 to 1.0 μm. By making the value of (D/E)×100 be 0.2 or above, the occurrence of streaking can be controlled, and further, the pit coarsening can be controlled. The upper limit of (D/E)×100 is on the order of 300, and if it is increased above this, improvements in the effects are small, and by making the hot rolling temperature low, the number of rolling passes and the like increases and the rolling costs increase.

"Metastable Phase Dispersion Layer"

Prior aluminum alloy plates for use as lithographic printing plates had a dispersion of stable phase of AlFe type intermetallic compound ($Al_3Fe$) particles, but those with a dispersion layer of a metastable phase were not known. The present invention, unlike the prior art, comprises a dispersion layer wherein a metastable phase of AlFe type intermetallic compound particles are dispersed in the surface layer portion. This metastable phase is shown as a ratio of $Al_4Fe$, $Al_5Fe$, and $Al_6Fe$, or $Al_mFe$ ($4<m<6$). These are present individually or as a mixed phase. Further, the metastable phase particles are usually constituted only of this metastable intermetallic composition, however, it is also acceptable for a stable intermetallic composition to be mixed therewith.

The above described metastable intermetallic composition particles, compared to intermetallic compound particles of a stable phase, can more readily be the starting point of pits, and effectively prevent the occurrence of unetched portions and increase the dispersibility of the pits. Further, it is more effective for the m of $Al_mFe$ to be close to 6.

"Dispersion Layer Depth"

The above dispersion layer is desirably formed from the surface to a depth of about 2 to 50 μm. In the production of an aluminum alloy plate for use as a lithographic printing plate, after rolling, and before electrolytic etching, degreasing by caustic washing, or surface layer removal by acid etching or mechanical polishing are carried out, and usually, in a chemical pretreatment, on the order of 0.1 to 2 μm, and in mechanical polishing, on the order of 0.1 to 5 μm is removed, and therefore, the depth of the dispersion layer is shown in a state before the removal of the surface layer, and after rolling. On the other hand, even if the dispersion layer exceeds 50 μm, this does not contribute to an improvement in the electrolytic etching, and therefore, a depth of the dispersion layer on the order of 50 μm is thought to be sufficient.

"Crystal Particles"

It is preferable for the crystal particles (of the material surface layer) in a direction perpendicular to the rolling direction to have an average width of 60 μm or less, and with crystal particles larger than this, the cathode solubility decreases and there is a tendency to intensify the occurrence of streaking, and further, at the time of bending, cracks can readily occur, and there is a great concern that the rupture resistance will be reduced.

"Ratio of the Metastable Phase to the Stable Phase (in the Dispersion Layer)"

In the dispersion layer, it is preferable to have dispersed therein about a certain ratio or above of intermetallic compound particles of a metastable phase which are excellent as starting points of pits.

Whether the intermetallic compound is a metastable phase or a stable phase is established by examining the ratio of the included amount of Fe to the included amount of Al in the particles. In the particles, in some cases the stable phase and the metastable phase can exist in contact with each other, but in this case it is possible to obtain sufficient function as a starting point of pits in the same way as for particles of a single metastable phase, and therefore, these can be considered as if they were a metastable phase. The above ratio can be shown in terms of the (Fe amount)/(Al amount) of each particle, and those particles for which this exceeds 0.6 ((Fe amount)/(Al amount)>0.6 . . . Eq. $A_1$) can be considered as stable phase particles, and those particles for which this is 0.6 or less ((Fe amount)/(Al amount)≦0.6 . . . Eq. $A_2$) can be considered a metastable phase.

In a composition of an intermetallic compound with a particle diameter of 0.1 μm or above, wherein the number of the metastable phase particles where the (Fe amount)/(Al amount) is 0.6 or less is C, and the total number of intermetallic compound particles is B, by making the value of C/B is 0.35 or above, it is possible to obtain improved effects of the dispersion of the metastable phase particles.

Further, it is not particularly necessary to determine an upper limit of the ratio of the metastable particles, but according to the constraints of the production method, it is usual for C/B to be on the order of 0.8, and even if it is higher than this, the improvement in effects is small, and by making the rolling temperature low, the costs increase by making the number of rolling passes increase and the like.

An aluminum alloy plate having the above composition and with the above intermetallic compound particles dispersed in its surface layer, can be produced by a method combining well known and usual production methods by changing one part of the same to specified conditions.

In the usual production method for the aluminum alloy, after making ingots with the target composition, a homogenezation process is carried out with the objective of eliminating segregation and the like of the components, and at this stage, the metastable phase is mostly no longer present. Further, in the heat treatment process (soaking treatment) before hot rolling, if there is sufficient heating, what little remains of the metastable phase is eliminated. Accordingly, in the production process, by carrying out suitable heat management, it is possible to obtain an aluminum alloy plate in a state wherein metastable particles are sufficiently dispersed.

Below, a process for producing one example of the aluminum alloy plate of the present embodiments will be explained.

First, the aluminum alloy of the present embodiment can be made into ingots by a usual method, and can be obtained for example, by adjusting the components and mixing the raw materials to form the target composition ratio, and casting. After this, in usual processes, homogenization of the components is done by carrying out a homogenization treatment at a temperature exceeding 550° C., but in the present embodiment, in order to obtain the metastable phase, the homogenization treatment is omitted, or the homogenization is carried out at a temperature of 550° C. or less, and after this, in the hot rolling process, rolling is carried out at a temperature of 550° C. or less, and then cold rolling is carried out to obtain an aluminum alloy plate of the desired thickness. Further, in the cold rolling process, it would not be problematic to subject the plate to an annealing process.

The aluminum alloy plate obtained in this way, before coating the photosensitizer, is subjected to surface washing by a caustic washing treatment using caustic soda or the like.

The aluminum alloy plate whose surface has been washed is subjected to a surface roughening treatment in order to roughen its surface, and this surface roughening treatment is done by electrolytic etching. In this electrolytic etching treatment, as the aluminum alloy plate is passed through the rolls, it is electrolytically treated by applying an alternating voltage to the electrodes. In this process, due to the relationship between the speed of passing through the rolls and the frequency of the alternating current, the degree of whitening at the cathode point and the anode point can change greatly, and in the direction perpendicular to the conveying direction (the direction along the width direction) of an aluminum alloy plate subjected to a conveying electrolytic etching treatment, streaking can easily occur.

On this point, for the aluminum alloy plate of the present embodiment, if the alloy composition is adjusted according to the previous disclosures, a balance of the electrolytic conditions between the anode point and the cathode point can be obtained, and therefore, streaking at the time of the roughening treatment by electrolysis does not readily occur. Further, the size, number, and composition of the intermetallic compound particles, which can form the starting points for the electrolysis as stated before, are controlled so as to be within a defined range, and therefore, the balance of the electrolysis conditions between the cathode point and the anode point can be further improved, and the occurrence of streaking can be controlled.

The photosensitive layer provided on the aluminum alloy plate of the present invention can be obtained by coating and drying a photosensitive liquid comprising a photosensitive composition. As the photosensitive liquid, it is possible to use one which has been used in the production of prior photosensitive lithographic printing plates.

As such a photosensitive liquid, (1) a positive type photosensitive composition comprising an o-quinone diazide compound; (2) a negative type photosensitive composition comprising a diazonium compound; (3) a negative type photosensitive composition comprising a composition comprising an addition polymerizable unsaturated group and a photo polymerization initiator; (4) a positive type laser photosensitive compound comprising an alkali soluble resin and a photothermal conversion agent; and (5) a negative type photosensitive compound comprising an alkali soluble resin, an acid generating agent, a crosslinking agent and a photothermal conversion agent; or the like; dissolved or dispersed in an organic solvent, are given as examples.

The o-quinone diazide compound in the positive type photosensitive composition comprising an o-quinone diazide compound is a composition comprising at least one o-quinone diazide group, and it is preferably one which has increased solubility in an alkaki aqueous solution as a result of active rays. Many compounds having a variety of structures are known as such compounds, for example, those disclosed in J. Kosar, "Light Sensitive Systems" (John Wiley & Sons, Inc., published in 1965), pp. 336-352. As an o-quinone diazide compound, in particular, sulphone esters of o-quinone diazides or o-naphthoauinone diazides and a variety of hydroxyl compounds are suitable.

In the (1) positive type photosensitive composition comprising an o-quinone diazide compound, it is possible to use as a binder resin a resin which is insoluble in water, but soluble in alkali aqueous solutions (below referred to as an alkali soluble resin), and this can improve the developing characteristics, the durability, solvent resistance, chemical resistance and the like. As the alkali soluble resin, for example, a novolak type resin or a resol type resin such as a phenol.formaldehyde resin, a cresol.formaldehyde resin, a phenol.cresol.formaldehyde cocondensed resin, or an acrylic type resin comprising one or more monomers comprising an acidic group, such as polyhydroxystyrene, polyhalogenated hydroxystyrene, N-(4-hydroxyphenyl) methacrylic amide, hydroquinone monomethacrylate, N-(sulfamoylphenyl) methacrylic amide, N-phenyl sulfonyl methacrylic amide, N-phenyl sulphonyl maleimide, acrylic acid, methacrylic acid and the like, and the like can be given as examples.

Further, it is possible to add various additives to the (1) positive type photosensitive composition comprising an o-quinone diazide compound, as necessary, a cyclic acid anhydride in order to increase its sensitivity, a print out agent in order to obtain an optical image immediately after exposure, a dye as an image coloring agent, other fillers, various types of resin comprising hydrophobic groups in order to improve the ink adhesiveness of the image, a plasticizer in order to improve the flexibility of the film, and the like.

As the diazonium compound in the (2) negative type photosensitive composition comprising a diazonium compound, for example, diazo resins represented by salts of condensates of diazodiarylamine and active carbonyl compounds, and those that have light sensitivity and that are insoluble in water but soluble in organic solvents are preferable. As particularly suitable diazo resins, for example, organic salts, and inorganic salts of condensates of 4-diazodiphenylamine, 4-diazo-3-methylphenylamine, 4-diazo-4'-methyldiphenylamine, 4-diazo-3'-methyldiphenylamine, 4-diazo-4'-methoxydiphenylamine, 4-diazo-3-methoxydiphenylamine, formaldehyde, paraformaldehyde, acetaldehyde, benzaldehyde, 4,4'-bis-methoxymethyl diphenylether and the like can be listed. Further, the (2) negative type photosensitive composition comprising a diazonium compound is usually used with a binder resin. As such a binder resin, for example, acrylic resin, polyamide resin, polyester resin, epoxy resin, polyacetal resin, polystyrene resin, novolak resin, and the like can be listed. Further, in order to improve the performance, well known additives, for example, thermal polymerization inhibitors, dyes, pigments, plasticizers, stabilizing agents, and the like can be added.

As the (3) negative type photosensitive composition comprising a compound comprising an addition polymerizable unsaturated group, and a photo polymerization initiator, there are the compositions comprising the compounds comprising an addition polymerizable unsaturated group having two or more terminal ethyl groups, and a photopolymerization initiator, disclosed in U.S. Pat. No. 2,760,863, U.S. Pat. No. 3,060,023, and Japanese Unexamined Patent Application, First Publication No. Sho 62-121448. The compound comprising an addition polymerizable unsaturated group is a monomer or oligomer comprising at least one and preferably two or more ethylenic unsaturated addition polymerizable groups per molecule, and having a boiling point of 100° C. or more. As the photopolymerization initiator, the α-carbonyl compounds disclosed in U.S. Pat. No. 2,367,661, the acyloin ether disclosed in U.S. Pat. No. 2,448,828, the α-hydrocarbon substituted aromatic acyloin compound disclosed in U.S. Pat. No. 2,722,512, the polyquinone compounds disclosed in U.S. Pat. No. 3,046,127, the triarylbiimidazole. P-aminophenylketone combination disclosed in U.S. Pat. No. 3,459,367, the trihalomethyl-s-triazine type compound disclosed in U.S. Pat. No. 4,239,850, the oxadiazole type compound disclosed in U.S. Pat. No. 4,212,970, the acridine and phenazine compounds disclosed in U.S. Pat. No. 3,751,259, the benzothiazole compound disclosed in Japanese Unexamined Patent Application, First Publication No. Sho 51-48516 and the like can be listed as examples. Further, to the (3) negative type photosensitive composition comprising a compound comprising an addition polymerizable unsaturated group and a photo polymerization initiator, it is possible to add a binder resin and well-known additives, such as a thermal polymerization inhibitor, pigment, dye, plasticizer, stabilizing agent, and the like.

As the alkali soluble resin of the (4) positive type laser photosensitive composion comprising an alkali soluble resin and a photothermal conversion agent, for example, the same alkali soluble resin used in the (1) positive type photosensitive composition comprising an o-quinone diazide compound can be used. The photothermal conversion agent is a substance which absorbs light and generates heat. As such a substance, a variety of pigments and dyes can be given as examples. As a pigment, commercially available pigments, and those disclosed in color index handbooks, such as the "Japan Pigment Society Newest Pigment Handbook, Published 1977", the "Newest Pigment Application Techniques" (CMC, published 1984), and the like can be used. As dyes, common and well known dyes can be used, for example, those disclosed in the "Dye Handbook" (Organic Synthetic Chemistry Society, published in the year Showa 45 (1970)), "Coloring Material Engineering Handbook" (Coloring Material Society, Asahikaura Booksellers, published 1989), "Technology and Markets of Industrial Colorants" (CMC, published 1983), and "Chemical Handbook: Applied Chemistry" (Japan Chemical Society, Maruzen Bookseller, published 1986). In particular, those having an absorbance region in the infrared region with wavelengths of 600 nm or above, preferably 750~1200 nm, which show a photothermal conversion function of these wavelengths are preferable.

As the alkali soluble resin and photothermal conversion agent of the (5) negative type laser photosensitive composition comprising an alkali soluble resin, an acid generating agent, a crosslinking agent and a photothermal conversion agent, it is possible to use the same alkali soluble resin and photothermal conversion agent as used in the (4) positive type laser photosensitive composition comprising an alkali soluble resin and a photothermal conversion agent. As the acid generating agent, well known onium salts such as ammonium salts, phosphonium salts, iodinium salts, sulphonium salts, selenium salts and the like, organic halogen compounds, photoacid generators comprising a o-nitrobenzoyl type protecting group, disulphonated compounds and the like can be given as examples. In particular, from the point that a high degree of sensitivity can be obtained, trihaloalkyl compounds and diazonium salt compounds can suitably be used. The crosslinking agent crosslinks as a result of the catalyzing action of the acid generated by the acid generating agent, and as long as it insolubilizes, it is not particularly limited. As such a crosslinking agent, amino compounds comprising at least two methylol groups, alkoxymethyl groups, acetoxymethyl groups and the like, can be given as examples. Specifically, melamine derivatives such as methoxymethylated melamine, benzoguanamine derivatives, glycol uryl derivatives and the like; urea resin derivatives; resol resins and the like can be given as examples.

As the organic solvent wherein these photosensitive compositions are dissolved or dispersed, any well known and common one can be used. Among these, those having boiling points in the range of 40° C. to 200° C., and in particular, from 60° C. to 160° C. are selected for their advantages at the time of drying. As the organic solvent, the alcohol class, the ketone class, the hydrocarbon class, acetic ester class, the ether class, the polyol class and its derivatives, dimethylsulphoxide, N,N-dimethylformamide, methyl lactate, ethyl lactate and the like are given as examples.

As the coating method for the photosensitive composition, for example, the methods of roll coating, dip coating, air knife coating, gravure coating, gravure offset coating, hopper coating, blade coating, wired coating, spray coating and the like can be used. The amount of coated photosensitive composition is suitably in the range of 10 ml/m$^2$ to 100 ml/m$^2$. The drying of the photosensitive composition coated onto the support body is usually carried out by heated air. The heating is suitably in the range of 30° C. to 200° C., in particular 40° C. to 140° C. For the heating temperature, in addition to a method of holding a fixed temperature during heating, a method of increasing the temperature stepwise can be employed. Further, by dehumidifying the drying air, preferable results can be obtained. The heated air is suitably supplied at a rate of 0.1 m/sec to 30 m/sec, in particular 0.5 m/sec to 20 m/sec with respect to the coating surface. The coating amount of the photosensitive compound usually has a dried weight in the range of about 0.5 to about 5 g/m$^2$.

Below, the present invention is explained based on the embodiments, but it is clear that the present invention is not limited to the below embodiments.

FIG. 1 shows one example constitution of the lithographic printing plate 3 formed by coating a photosensitive layer 2 on the aluminum alloy plate 1 of the present invention. The surface of an aluminum alloy plate as in this example is subjected to surface treatments such as a surface roughening treatment (graining) by electrolytic etching and anodic oxidation treatment and with the surface maintained in this way, the lithographic printing plate 3 is coated with a photosensitive layer 2.

"Manufacturing of the Aluminum Alloy Plate"

For a slag obtained by adjusting the raw materials to obtain the target composition ratio and casting, a soaking treatment was carried out without carrying out a homogenization treatment, and an aluminum alloy plate with a thickness of 6 mm was obtained by hot rolling. Further, this aluminum alloy plate is rolled to a thickness of 0.3 mm by cold working to obtain aluminum alloy test samples.

Further, from the above slag, test samples were obtained by carrying out a homogenization process at a temperature in the range of 450° C. to 600° C., a soaking process at 400° C. to 600° C. and hot rolling to a thickness of 6 mm, and further rolling by a cold rolling process to a thickness of 0.30 mm.

The obtained aluminum alloy plates were degreased in an aqueous solution of sodium hydroxide, and were immersed in a 2% aqueous solution of hydrochloric acid at room temperature, and an AC current of 50 Hz, 100 A/dm$^2$ was applied between the aluminum alloy plate and carbon electrodes, and further, an electrolytic etching treatment was carried out by moving the aluminum alloy plate at a speed of 20 m/min with respect to the electrodes. After this treatment, the aluminum alloy plate was washed with water, washed for 1 min in 10% sulfuric acid at room temperature, neutralized, further washed with water and dried. In the above production process, a plurality of test samples were manufactured with variously adjusted compositions of the aluminum plates, and a plurality of test samples were manufactured with various different values of the included amounts of Cu, Fe, Mg, and Zn with the relationship "$0.15 \geqq Zn+Mg-(Fe/10)-Cu$", and further, measurements of the numbers of particles, included amount and crystal particle size of the intermetallic compounds were carried out, and the measured value of the proportion [C]/[B] of the metastable phase of the composition of the intermetallic compound, the streaking conditions, and the rupture resistance and printing durability were studied.

In the results, the results for the test samples of the present invention are shown in Table 2, and the results for the test samples outside the range of the present invention are shown in Table 4.

Further, the surface of the obtained aluminum alloy plate was visually inspected, and those on which streaking was not observed at all are indicated with ◎, those for which some streaking was observed are indicated with ○, and those for which streaking was clearly observed are indicated with X in Tables 3 and 5 disclosed below.

For the particle numbers of the intermetallic compound, using a scanning electron microscope, the electron reflection image of the surface of the aluminum alloy plate was observed at a magnification of 3000 times. Observation was carried out at 20 random locations, and the number of particles with an equivalent-circle diameter of 0.1 μm or more and their equivalent-circle diameters were measured. Further, by EPMA, the ratio of Fe and Al of each intermetallic compound particle was measured, and is shown in Tables 3 and 5.

Concerning the rupture resistance, as substitute test samples after subjecting the previous aluminum alloy plates having a thickness of 0.30 mm to the above electrolytic etching, a portion corresponding to the anode position having streaking as the front was bent to an interior angle of 20°, and this bent portion was observed by an optical microscope, and in Tables 3 and 5, those samples where cracks were observed are evaluated as X, and those where cracks were not observed are evaluated as ○.

Concerning the printing durability, an aluminum plate subjected to the above electrolytic etching, had a sulphuric alumite coating of 2.7 g/m$^2$ formed thereon at 2 A/dm$^2$ in a 20% sulphuric acid solution. This anodic oxidized plate, after a hydrophilization treatment, was washed with water and dried to obtain an aluminum support body.

Then the coating liquid of the photosensitive composition in the following Table 1 is coated at low speed with a roll coater onto the aluminum support body, and dried for 3 min at 100° C. to obtain a photosensitive lithographic printing plate. The amount of the dry coating was 2.0 g/m$^2$. A solid or halftone dot negative image film, a 0.15 step step wedge glued to the obtained photosensitive lithographic printing plate. Using a 2 kW output metal halide lamp provided at a distance of 1 m from the photosensitive lithographic printing plate, the photosensitive lithographic printing plate was exposed with an exposure time to make the sensitivity a 4 step. After this, using a PD-912 automatic developing machine manufactured by Dainippon Screen Mfg. Co., Ltd., and an ND-1 developing solution for negative printing manufactured by Kodak Polychrome Graphics Japan Ltd, (dilution ratio 1:3), the exposed photosensitive lithographic printing plate was subjected to a developing treatment for 20 sec at 30° C. and coated with NF-2 gum manufactured by Kodak Polychrome Graphics Japan Ltd. Printing was carried out using the obtained lithographic printing plate. After it was attached to the print cylinder and 300,000 prints were made, the image fading was observed. Test samples for which image fading were found are indicated by X, and those for which it was not found are indicated by ○ in Tables 3 and 5.

Concerning the uniformity of the roughened surface, for the above samples, an electrolytic etching treatment was carried out under the conditions of 30 sec with a current of 60 A/dm$^2$ at a frequency of 50 Hz, at a solution temperature of 25° C. in a 2% hydrochloric acid solution, and after the treatment, their surfaces were observed by SEM at a magnification of 500×, and the test samples where the large pits having an equivalent-circle diameter exceeding 10 μm have a surface area ratio of 5% or more with respect to the total number of pits are indicated in Tables 3 and 5 with X, those samples where they are present from 2% or more to less than 5% are shown as Δ in the tables, and those where the samples are less than 2% are indicated with ○.

To obtain the value of (D/E)×100, approximately 1 g of an aluminum test sample was dissolved in 100 g of phenol at 180° C., 100 g of benzyl alcohol was added and after reheating to 180° C., filtered with a membrane filter with a pore size of 1.0 μm, and particles with a size of 1.0 μm or more were trapped, and after washing with benzyl alcohol, the weight of the dried trapped particles was measured as "E". The filtered liquid was filtered with a 0.1 μm membrane filter to trap the particles of 0.1 μm and above and less than 1.0 μm, and after these were washed with benzyl alcohol, the weight of the dried trapped particles was measured as "D". Their ratio was taken to calculate the value of (D/E)×100. The results are shown in Tables 3 and 5.

TABLE 1

| Coating Liquid of the Photosensitive Composition | Units: g |
|---|---|
| 2-hydroxyethylmethacrylate copolymer (disclosed in Example 1 of Japanese Unexamined Patent Application, First Publication No. 50-118802) | 1.75 |
| 2-methoxy-4-hydroxy-5-benzoylbenzene sulphonic acid salt of condensate of p-diazodiphenylamine and formaldehyde | 0.20 |
| Oil blue #603 [mfg. by Orient Chemical Industries, Ltd.] | 0.05 |
| Megaface F-177 [fluorinated surfactant mfg. by Dainippon Ink and Chemicals, Inc.] | 0.015 |
| Methylglycol | 28.0 |
| methyl cellosolve acetate | 20.0 |

TABLE 2

| Test Sample | Chemical Components | | | | | | Relational Formula Zn + Mg − (Fe/10) − Cu |
|---|---|---|---|---|---|---|---|
| No. | Fe | Si | Cu | Zn | Mg | Ti | |
| 1 | 0.1 | 0.02 | 0.003 | 0.05 | 0.030 | 0.01 | 0.067 |
| 2 | 0.3 | 0.1 | 0.003 | 0.05 | 0.032 | 0.01 | 0.047 |
| 3 | 0.6 | 0.1 | 0.003 | 0.03 | 0.030 | 0.01 | −0.003 |
| 4 | 0.3 | 0.2 | 0.003 | 0.03 | 0.033 | 0.01 | 0.027 |
| 5 | 0.3 | 0.1 | 0.001 | 0.03 | 0.032 | 0.01 | 0.029 |
| 6 | 0.3 | 0.1 | 0.02 | 0.03 | 0.030 | 0.01 | 0.01 |
| 7 | 0.3 | 0.1 | 0.003 | 0.01 | 0.031 | 0.01 | 0.007 |
| 8 | 0.3 | 0.1 | 0.003 | 0.10 | 0.030 | 0.01 | 0.097 |

TABLE 2-continued

| Test Sample No. | Chemical Components Fe | Si | Cu | Zn | Mg | Ti | Relational Formula Zn + Mg − (Fe/10) − Cu |
|---|---|---|---|---|---|---|---|
| 9 | 0.3 | 0.1 | 0.003 | 0.03 | 0.005 | 0.01 | 0.002 |
| 10 | 0.3 | 0.1 | 0.003 | 0.03 | 0.100 | 0.01 | 0.097 |
| 11 | 0.3 | 0.1 | 0.003 | 0.03 | 0.031 | 0.001 | 0.027 |
| 12 | 0.3 | 0.1 | 0.003 | 0.03 | 0.030 | 0.05 | 0.027 |
| 13 | 0.1 | 0.1 | 0.002 | 0.08 | 0.080 | 0.01 | 0.148 |
| 14 | 0.3 | 0.1 | 0.003 | 0.03 | 0.030 | 0.01 | 0.027 |
| 15 | 0.3 | 0.1 | 0.003 | 0.03 | 0.031 | 0.01 | 0.027 |
| 16 | 0.3 | 0.1 | 0.003 | 0.03 | 0.030 | 0.01 | 0.027 |
| 17 | 0.3 | 0.1 | 0.006 | 0.03 | 0.033 | 0.01 | 0.027 |
| 17a | 0.3 | 0.1 | 0.004 | 0.03 | 0.030 | 0.01 | 0.025 |
| 17b | 0.3 | 0.1 | 0.003 | 0.03 | 0.030 | 0.01 | 0.026 |
| 17c | 0.3 | 0.1 | 0.003 | 0.03 | 0.020 | 0.01 | 0.017 |
| 17d | 0.3 | 0.1 | 0.003 | 0.03 | 0.021 | 0.01 | 0.018 |
| 17e | 0.3 | 0.1 | 0.003 | 0.03 | 0.080 | 0.01 | 0.107 |
| 17f | 0.3 | 0.1 | 0.003 | 0.023 | 0.032 | 0.01 | 0.022 |
| 17g | 0.3 | 0.1 | 0.003 | 0.025 | 0.035 | 0.01 | 0.024 |
| 17h | 0.3 | 0.1 | 0.005 | 0.03 | 0.030 | 0.01 | 0.025 |
| 17i | 0.3 | 0.1 | 0.003 | 0.08 | 0.030 | 0.01 | 0.077 |

TABLE 4

| Test Sample No. | Chemical Components Fe | Si | Cu | Zn | Mg | Ti | Relational Formula Zn + Mg − (Fe/10) − Cu |
|---|---|---|---|---|---|---|---|
| 18 | 0.04 | 0.02 | 0.005 | 0.05 | 0.030 | 0.01 | 0.071 |
| 19 | 0.7 | 0.02 | 0.005 | 0.05 | 0.030 | 0.01 | 0.005 |
| 20 | 0.3 | 0.28 | 0.005 | 0.04 | 0.021 | 0.01 | 0.025 |
| 21 | 0.3 | 0.2 | 0.0004 | 0.03 | 0.022 | 0.01 | 0.0196 |
| 22 | 0.3 | 0.1 | 0.026 | 0.03 | 0.021 | 0.01 | −0.006 |
| 23 | 0.3 | 0.1 | 0.005 | 0.003 | 0.023 | 0.01 | −0.012 |
| 24 | 0.3 | 0.1 | 0.005 | 0.16 | 0.021 | 0.01 | 0.145 |
| 25 | 0.3 | 0.1 | 0.005 | 0.05 | 0.004 | 0.01 | 0.019 |
| 26 | 0.3 | 0.1 | 0.005 | 0.03 | 0.160 | 0.01 | 0.155 |
| 27 | 0.3 | 0.1 | 0.005 | 0.03 | 0.030 | 0.0004 | 0.025 |
| 28 | 0.3 | 0.1 | 0.005 | 0.03 | 0.021 | 0.06 | 0.025 |
| 29 | 0.1 | 0.1 | 0.001 | 0.1 | 0.100 | 0.01 | 0.189 |

TABLE 3

| Test Sample No. | Crystal Particle Diameter (μm) | Particle Number A/B | Metastable Phase C/B | Homogenization Treatment | Streaking | Rupture resistance/ Printing durability | (D/E) × 100 | Roughened Surface Uniformity |
|---|---|---|---|---|---|---|---|---|
| 1 | 46 | 0.38 | 0.37 | 550° C. × 3 hr | ⊚ | ○/○ | 0.304 | ○ |
| 2 | 46 | 0.3 | 0.38 | 530° C. × 3 hr | ⊚ | ○/○ | 0.240 | ○ |
| 3 | 46 | 0.21 | 0.45 | none | ⊚ | ○/○ | 0.168 | ○ |
| 4 | 46 | 0.3 | 0.36 | none | ⊚ | ○/○ | 0.240 | ○ |
| 5 | 46 | 0.3 | 0.36 | none | ⊚ | ○/○ | 0.240 | ○ |
| 6 | 46 | 0.3 | 0.36 | none | ⊚ | ○/○ | 0.240 | Δ |
| 7 | 46 | 0.3 | 0.37 | 510° C. × 3 hr | ⊚ | ○/○ | 0.240 | Δ |
| 8 | 46 | 0.3 | 0.38 | none | ⊚ | ○/○ | 0.240 | Δ |
| 9 | 46 | 0.3 | 0.40 | none | ⊚ | ○/○ | 0.240 | Δ |
| 10 | 46 | 0.3 | 0.39 | 500° C. × 5 hr | ⊚ | ○/○ | 0.240 | ○ |
| 11 | 46 | 0.3 | 0.36 | none | ⊚ | ○/○ | 0.240 | ○ |
| 12 | 46 | 0.3 | 0.36 | none | ⊚ | ○/○ | 0.240 | ○ |
| 13 | 46 | 0.3 | 0.37 | 530° C. × 3 hr | ⊚ | ○/○ | 0.240 | ○ |
| 14 | 60 | 0.3 | 0.36 | none | ⊚ | ○/○ | 0.240 | ○ |
| 15 | 46 | 0.18 | 0.35 | none | ○ | ○/○ | 0.144 | ○ |
| 16 | 46 | 0.3 | 0.33 | 560° C. × 3 hr | ○ | ○/○ | 0.240 | ○ |
| 17 | 46 | 0.3 | 0.11 | 580° C. × 1 hr | ○ | ○/○ | 0.144 | ○ |
| 17a | 46 | 0.3 | 0.36 | none | ○ | ○/○ | 0.240 | Δ |
| 17b | 46 | 0.3 | 0.35 | none | ⊚ | ○/○ | 0.240 | ○ |
| 17c | 46 | 0.3 | 0.36 | none | ○ | ○/○ | 0.240 | Δ |
| 17d | 46 | 0.3 | 0.37 | none | ○ | ○/○ | 0.241 | ○ |
| 17e | 46 | 0.3 | 0.38 | 510° C. × 3 hr | ⊚ | ○/○ | 0.241 | Δ |
| 17f | 46 | 0.3 | 0.37 | 510° C. × 3 hr | ⊚ | ○/○ | 0.240 | Δ |
| 17g | 46 | 0.3 | 0.36 | 510° C. × 3 hr | ⊚ | ○/○ | 0.242 | ○ |
| 17h | 46 | 0.3 | 0.37 | none | ○ | ○/○ | 0.240 | ○ |
| 17i | 46 | 0.3 | 0.38 | none | ⊚ | ○/○ | 0.241 | ○ |

TABLE 5

| Test Sample No. | Crystal Particle Diameter (μm) | Particle Number A/B | Metastable Phase C/B | Homogenization Treatment | Streaking | Rupture resistance/ Printing Durability | (D/E) × 100 | Roughened Surface Uniformity |
|---|---|---|---|---|---|---|---|---|
| 18 | 61 | 0.43 | 0.35 | 550° C. × 2 hr | X | X/X | 0.344 | Δ |
| 19 | 41 | 0.21 | 0.51 | None | X | X/X | 0.168 | Δ |
| 20 | 38 | 0.38 | 0.39 | 530° C. × 1 hr | X | X/X | 0.304 | Δ |
| 21 | 45 | 0.3 | 0.35 | None | X | X/X | 0.240 | ○ |
| 22 | 46 | 0.25 | 0.38 | None | X | X/X | 0.200 | Δ |
| 23 | 43 | 0.28 | 0.36 | None | X | X/X | 0.224 | Δ |
| 24 | 46 | 0.3 | 0.38 | 510° C. × 2 hr | X | X/X | 0.240 | Δ |
| 25 | 43 | 0.28 | 0.37 | None | ◎ | X/X | 0.224 | X |
| 26 | 45 | 0.29 | 0.38 | None | X | X/X | 0.232 | Δ |
| 27 | 63 | 0.3 | 0.39 | 500° C. × 5 hr | X | X/X | 0.240 | Δ |
| 28 | 37 | 0.55 | 0.40 | None | X | X/X | 0.240 | Δ |
| 29 | 46 | 0.31 | 0.36 | None | X | X/X | 0.248 | Δ |

In sample No. 1 of Table 2, the included amounts of Fe and Si are the lower limits of the range of the present invention, and the other conditions are within the range of the present invention, and according to the results shown in Table 3, the occurrence of streaking was not observed, and also from the viewpoint of rupture resistance and printing durability, problems did not occur. In contrast, sample No. 19 of Table 4 has an increased included amount of Fe, and Sample No. 20 has an increased included amount of Si, and according to the results shown in Table 5, streaking did occur, and problems also occurred from the viewpoint of rupture resistance and printing durability.

In sample No. 2 of Table 2, the included amounts of Fe, Si, Cu, Zn and Ti, the value of the relationship expression, the crystal particle size, the value of A/B, and the value of C/B are all within the range of the present invention, and as shown in Table 3, the occurrence of streaking was not observed, and also from the viewpoint of both rupture resistance and printing durability, problems did not occur.

In sample No. 3 of Table 2, the included amount of Fe is the upper limit of the present invention, in sample No. 4 the included amount of Si is the upper limit, in sample No. 5 the included amount of Cu is the lower limit, in sample No. 6 the included amount of Cu is the upper limit, in sample No. 7 the included amount of Zn is the lower limit, in sample No. 8 the included amount of Zn is the upper limit, and as shown in Table 3, the occurrence of streaking was not observed, and from the viewpoint of rupture resistance and printing durability, problems did not occur.

In sample No. 9 of Table 2, the included amount of Mg is the lower limit, in sample No. 10 the included amount of Mg is the upper limit, in sample No. 11 the included amount of Ti is the lower limit, in sample No. 12 the included amount of Ti is the upper limit. In all of these samples, the occurrence of streaking was not observed, and from the viewpoint of rupture resistance and printing durability, problems did not occur.

Further, in sample No. 6 of Table 2, the included amount of Cu is 0.02 wt %, and therefore, the roughened surface uniformity is Δ, in sample No. 7 the included amount of Zn is 0.01 wt %, and therefore, the roughened surface uniformity is Δ, and in sample No. 9 the included amount of Mg is 0.005 wt %, and therefore, the roughened surface uniformity is Δ.

Sample No. 13 of Table 2 is within the range of the composition of the present invention, and sample No. 14, as shown in Table 3, has a crystal particle size of the upper limit of 60 μm, and the occurrence of streaking was not observed, and from the viewpoint of rupture resistance and printing durability, problems did not occur.

Sample No. 15 of Table 2 is within the composition range of the present invention, but the number of particles of the intermetallic compound is outside of the range of 0.2 or above of the present invention. In sample No. 15, as shown in Table 3, the occurrence of streaking was slight, and there was no problem concerning rupture resistance and printing durability. Sample No. 16 of Table 2 is within the composition range of the present invention, but the ratio of C/B is outside of the range of 0.35 or above of the present invention, and further, the homogenization treatment was carried out at a temperature exceeding the upper limit of 550° C. of the preferable homogenization treatment of the present invention. For this sample No. 16 as shown in Table 3, the occurrence of streaking was slight, and there was no problem concerning rupture resistance and durability.

Sample No. 17 of Table 2 has a C/B ratio outside of the range of the present invention of 0.35 and above, and further had a homogenization treatment at a temperature exceeding 550° C. which is the preferable homogenization treatment of the present invention. For this sample No. 17, as shown in Table 3, there was a slight occurrence of streaking, but there were no problems concerning rupture resistance and printing durability.

Sample No. 17*a* of Table 2 has a larger amount of Cu (Cu 0.006%) than the more preferable range of the included amount of Cu of the present invention (0.005% or less), and as a result there was a slight occurrence of streaking, and the roughened surface uniformity had a result of Δ.

Sample No. 17*b* of Table 2 has an included amount of Cu within the preferable range of the present invention (0.004 wt %, less than 0.005 wt %) and showed the favorable result that streaking was not observed.

Sample No. 17*c* of Table 2 has a lower amount of Mg (Mg 0.020%) than the more preferable range of the included amount of Mg of the present invention (Mg 0.021 or above), and as a result there was a slight occurrence of streaking, and the roughened surface uniformity had a result of Δ.

Next, concerning the roughened surface uniformity, sample No. 17*c* for which Mg is outside of the preferable range has a roughened surface uniformity of Δ, but for sample No. 17*d*, which is inside the preferable range, it was ○. Sample No. 10 with an included amount of Mg of 0.001 wt % was ○, sample No. 17*e* with an included amount of Mg. of 0.0080 wt % was Δ. Next, sample No. 17*f* included 0.023 wt % of Zn, which is outside the preferable range of the present invention, and the roughened surface uniformity had a result of Δ, sample No. 17*e* which has an included amount of Zn of 0.025 wt %, within the preferable range, has a roughened surface uniformity of ○. Further, sample No. 8 has a greater amount of Zn than the preferable range and therefore the roughened surface uniformity is Δ, and sample No. 17*i* which is within the preferable range has a roughened surface uniformity of Δ.

Next, concerning the preferable range of Cu, sample No. 17*a* has an included amount of 0.006 wt % which is greater than the preferable range and therefore the roughened surface uniformity was Δ, sample No. 17*h* has the preferable upper limit of the preferable range of 0.005 wt % and was ○. Further, from a comparison of the streaking of sample No. 17*b* and sample No. 17*h*, it can be judged that it is more preferable for the included amount of Cu to be 0.004 wt % or less.

Sample No. 18 of Table 4 has an included amount of Fe which is lower than the range of the present invention, and as shown in Table 5, this sample has a crystal particle diameter exceeding the range of the present invention and streaking occurred, and problems also occurred concerning rupture resistance and printing durability. Sample No. 19 of Table 2 has an included amount of Fe which is greater than the range of the present invention, and streaking occurred, and problems also occurred concerning rupture resistance and printing durability.

Sample No. 20 of Table 4 has an included amount of Si which is greater than the range of the present invention, and as shown in Table 5, streaking occurred, and problems also occurred rupture resistance and printing durability.

Sample No. 21 of Table 4 has an included amount of Cu which is below the range of the present invention, and as shown in Table 5, streaking occurred, and problems also occurred concerning rupture resistance and printing durability.

Sample No. 22 of Table 4 has an included amount of Cu which is above the range of the present invention, and as shown in Table 5, streaking occurred, and problems also occurred concerning rupture resistance and printing durability.

Sample No. 23 of Table 4 has an included amount of Zn which is below the range of the present invention, and as shown in Table 5, streaking occurred, and problems also occurred concerning rupture resistance and printing durability.

Sample No. 24 of Table 4 has an included amount of Zn which is above the range of the present invention, and as shown in Table 5, streaking occurred, and problems also occurred concerning rupture resistance and printing durability.

Sample No. 25 of Table 4 has an included amount of Mg which is below the preferable range of the present invention, and as shown in Table 5, there was no occurrence of streaking, but problems occurred concerning rupture resistance and printing durability.

Sample No. 26 of Table 4 has an included amount of Mg which is above the preferable range of the present invention, and as shown in Table 5, streaking occurred, and problems also occurred concerning rupture resistance and printing durability.

Sample No. 27 of Table 4 has an included amount of Ti which is below the preferable range of the present invention, and sample No. 28 has an included amount of Ti which is above the preferable range of the present invention, and as shown in Table 5, streaking occurred, and problems also occurred concerning rupture resistance and printing durability.

Sample No. 29 of Table 4 has an elemental composition within the range of the present invention, however, the value of the relationship formula is above the range of the present invention, and as shown in Table 5, streaking occurred, and there were also problems with rupture resistance and printing durability.

The invention claimed is:

1. An aluminum alloy plate for use as a lithographic printing plate, the aluminum alloy plate comprising, in wt %, Fe: 0.1 to 0.6%; Si: 0.02 to 0.2%; Cu: 0.001 to 0.003%; Zn: 0.01 to 0.1%; Mg: 0.021 to 0.1%; Ti: 0.001 to 0.05%, and the remainder aluminum and inevitable impurities, and the aluminum alloy plate comprising a plurality of AlFe intermetallic compound particles in its metal structure, and wherein:

an average value of the crystal particle size is 60 μm or less in a direction perpendicular to the rolling direction;

the included amounts of Cu, Fe, Zn, and Mg satisfy the relationship:

$$0.15 \geqq (Zn+Mg-(Fe/10)-Cu);$$

the composition of said AlFe intermetallic compound particles having a particle size of 0.1 μm or above, the value of C/B is 0.35 or above when C is a number of AlFe metastable phase intermetallic compound particles having a ratio of Fe/Al of 0.6 or less, and B is a total number of AlFe intermetallic compound particles; and a value of A/B is 0.2 or above in the case that in said AlFe intermetallic compound particles, A is a number of AlFe intermetallic compound particles having an equivalent-circle diameter of 0.1 to 1.0 μm, and B is a total number of AlFe intermetallic compound particles having a particle size of 0.1 or above.

2. The aluminum alloy plate for use as a lithographic printing plate of claim 1 wherein, a value of (D/E)×100 is 0.20 or above in the case that in said AlFe intermetallic compound particles, D is an included amount of AlFe intermetallic compound particles having an equivalent circle diameter of 0.1 μm or above and less than 1.0 μm, and E is an included amount of AlFe intermetallic compound particles above 1.0 μm.

3. The aluminum alloy plate for use as a lithographic printing plate of claim 1, wherein the plate comprises 0.03 wt % of less of each of the impurities Mn, Y, Sn, Zr, Ga, Ni, and In.

4. The aluminum alloy plate for use as a lithographic printing plate of claim 1, which is surface roughened by electrolytic treatment in an electrolytic solution for electrolytic etching treatment which is supplied by a roll and an AC current is applied to the roll.

5. The aluminum alloy plate for use as a lithographic printing plate of claim 4, additionally comprising a photosensitive layer on the surface roughened by electrolytic treatment.

6. The aluminum alloy plate for use as a lithographic printing plate of claim 1, in which the value of C/B is less than 0.8.

7. The aluminum alloy plate for use as a lithographic printing plate of claim 1, wherein the AlFe intermetallic compound particles have the formula $Al_mFe$, where $4<m<6$.

8. The aluminum alloy plate for use as a lithographic printing plate of any one of claims 1, 2, 3, 6, and 5, and 7, the aluminum alloy plate comprising a metastable phase dispersion layer which is formed from the surface of the aluminum plate to a depth of 2 to 50 μm, wherein the metastable phase dispersion layer comprises AlFe intermetallic compound particles.

9. The aluminum alloy plate for use as a lithographic printing plate of any of claims 1, 2, 3, 4, 6, 5, and 7 in which the aluminum alloy plate comprises, in wt %, Fe: 0.2 to 0.4%; Si: 0.05 to 0.15%; Cu: 0.001 to 0.003%; Zn: 0.025 to 0.08%; Mg: 0.02 to 0.04%; and Ti: 0.005 to 0.02%, and the remainder aluminum and inevitable impurities.

* * * * *